United States Patent
Aspar et al.

(10) Patent No.: US 7,807,548 B2
(45) Date of Patent: Oct. 5, 2010

(54) PROCESS OF FORMING AND CONTROLLING ROUGH INTERFACES

(75) Inventors: Bernard Aspar, Rives (FR); Chrystelle Lagahe Blanchard, Saint Joseph de Riviere (FR); Nicolas Sousbie, Grenoble (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 340 days.

(21) Appl. No.: 11/827,715

(22) Filed: Jul. 13, 2007

(65) Prior Publication Data

US 2008/0176382 A1 Jul. 24, 2008

(30) Foreign Application Priority Data

Jan. 22, 2007 (FR) .................................. 07 52803

(51) Int. Cl.
*H01L 21/30* (2006.01)
(52) U.S. Cl. ...................... 438/455; 438/459; 438/665; 438/770; 257/E21.284
(58) Field of Classification Search ................ 257/455, 257/459, 665, 758, 770; 438/E21.284
See application file for complete search history.

(56) References Cited

U.S. PATENT DOCUMENTS

| 5,882,538 | A |   | 3/1999  | Martin et al. |
|-----------|---|---|---------|---------------|
| 6,146,979 | A | * | 11/2000 | Henley et al. ................ 438/458 |
| 6,962,882 | B2|   | 11/2005 | Nozaki et al. |
| 2005/0048738 | A1 |   | 3/2005 | Shaheen et al. |
| 2006/0281212 | A1 | * | 12/2006 | Moriceau et al. .............. 438/48 |
| 2007/0020947 | A1 |   | 1/2007 | Daval et al. |

FOREIGN PATENT DOCUMENTS

| EP | 1 156 531 | A1 |   | 11/2001 |
|----|-----------|----|---|---------|
| EP | 1 638 141 | A1 |   | 3/2006  |
| FR | 2 857 953 | A  |   | 1/2005  |
| KR | 2004-0058477 | A | * | 7/2004 |
| KR | 2004 0058477 | A |   | 7/2004 |

OTHER PUBLICATIONS

Lai et al., "Limiting Si/SiO2 interface roughness resulting from thermal oxidation", Journal of Applied Physics, Aug. 1999, vol. 86, No. 3, pp. 1729-1735.*

(Continued)

*Primary Examiner*—Ha Tran T Nguyen
*Assistant Examiner*—Daniel Whalen
(74) *Attorney, Agent, or Firm*—Edwards Angell Palmer & Dodge LLP

(57) ABSTRACT

The invention provides a method for forming a semiconductor component with a rough buried interface. The method includes providing a first semiconductor substrate having a first surface of roughness R1. The method further includes thermally oxidizing the first surface of the first semiconductor substrate to form an oxide layer defining an external oxide surface on the first semiconductor substrate and a buried oxide-semiconductor interface below the oxide surface, so that the buried oxide surface has a roughness R2 that is less than R1. The method also includes assembling the oxide surface of the first semiconductor substrate with a second substrate. The invention also provides a component formed according to the method of the invention.

17 Claims, 3 Drawing Sheets

OTHER PUBLICATIONS

Liu Q., Wall J.F.; Irene E. A: "Si/SiO2 interface studies by spectroscopic immersion ellipsometry and atomic force microscopy", Journal of Vacuum Science & Technology A (Vacuum, Surfaces, and Films), vol. 12, No. 5, Sep. 1994, pp. 2625-2629, XP002457278 USA.

French Search Report dated Oct. 31, 2007.

L. Lai et al., "A study of the relationship between Si/SiO$_2$ between interface charges and roughness", Journal of Vacuum Science & Technology B: Microelectronics Processing and Phenomena, American Vacuum Society, New York, New York, vol. 17, No. 1, Jan. 1999, pp. 53-59.

L. Lai et al., "Limiting Si/SiO$_2$ interface roughness resulting from thermal oxidation", Journal of Applied Physics, American Institute of Physics. New York, New York, vol. 86, No. 3, Aug. 1, 1999, pp. 1729-17735.

French Search Report dated May 22, 2007.

\* cited by examiner

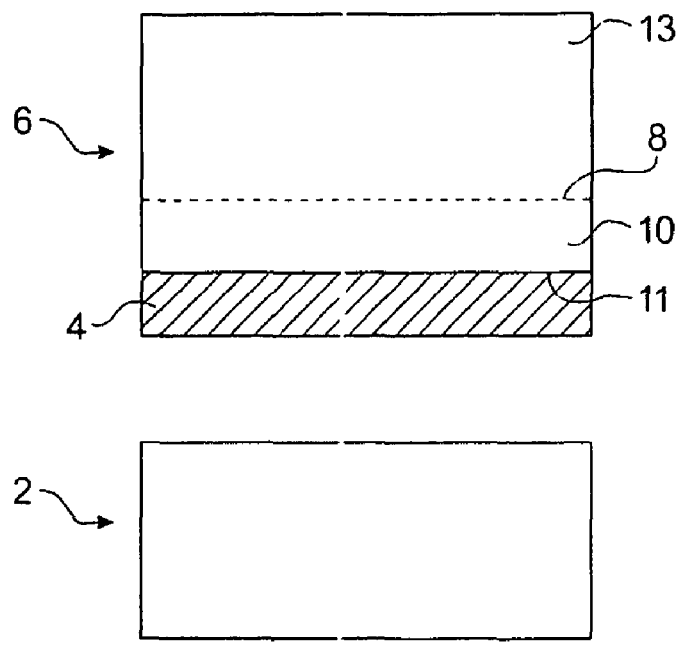
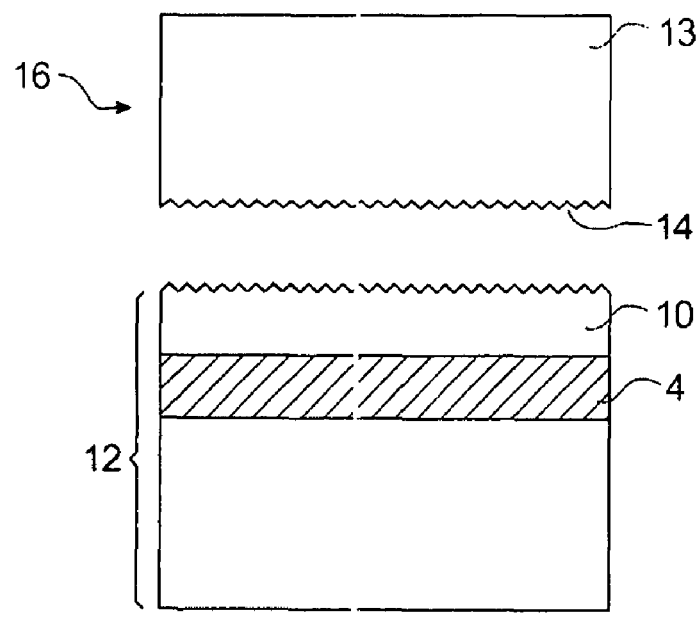
FIG.1A
FIG.1B

PROCESS OF FORMING AND CONTROLLING ROUGH INTERFACES

BACKGROUND OF THE INVENTION

1. Field of the Invention

The present invention relates to the field of microstructure manufacturing as well as treating substrates in semiconductor materials.

2. Description of Related Art

In microelectronics, certain operations, such as bonding operations, require surfaces to be bonded to be as smooth as possible. But the manufacturing of certain devices, particularly the type implementing a membrane or mobile part, may necessitate having surfaces that face each other without adhering to each other because of the need to prevent untimely bonding of the membrane on the facing surface, or because the membrane on the facing surface needs to be able to maintain mobility.

French Patent No. 2 857 953 discloses a process of manufacturing bonded silicon on insulator ("BSOI") type structures in which a so-called structured zone is made, preventing bonding between surfaces. This type of structure is applicable to MEMS fabrication, and more particularly to situations where a superficial silicon membrane must be released to manufacture sensors. During the release step, which includes an underlying oxide attack, for example, or during operation of the sensor, if the membrane bonds to the substrate, the bonding induces dysfunction of the component. As explained in the document above, a BSOI substrate that includes a rough buried interface avoids this problem, as the roughness of the buried interface prevents any bonding between the membrane and the support.

In French Patent No. 2 857 953, roughening of the surface is accomplished by various techniques, for example by the use of "Unibond® negatives", produced by the "Smart Cut™" process. Such a process is described in French Patent No. 2 681 472, as well as in B. Aspar et al., "The generic nature of the smart cut process for thin film transfer," J. of Elec. Material, vol. 30, No. 7, 2001. To obtain the buried roughness adapted to different anti-sticking BSOI substrates, it is necessary to provide negatives having the desired roughness.

Such conventional methods and systems generally have been considered satisfactory for their intended purpose. However, providing a substrate or negative with a particular roughness, or in other words, controlling the amount of roughness provided on a negative or substrate is difficult if not impossible. There still remains a continued need in the art for a method of manufacturing membranes or mobile parts in integrated components wherein the bonding effects above are avoided by providing a specific surface roughness on the components in question. The present invention provides a solution for these problems.

SUMMARY OF THE INVENTION

The purpose and advantages of the present invention will be set forth in and become apparent from the description that follows. Additional advantages of the invention will be realized and attained by the methods and systems particularly pointed out in the written description and claims hereof, as well as from the appended drawings.

To achieve these and other advantages and in accordance with the purpose of the invention, as embodied herein, the invention includes a method for forming a semiconductor component with a rough buried interface. The method includes providing a first semiconductor substrate having a first surface of roughness R1. The method further includes thermally oxidizing the first surface of the first semiconductor substrate to form an oxide layer defining an external oxide surface on the first semiconductor substrate and a buried oxide-semiconductor interface below the oxide surface, so that the buried oxide surface has a roughness R2 that is less than R1. The method also includes assembling the oxide surface of the first semiconductor substrate with a second substrate.

In accordance with a further aspect of the invention, the method further includes preparing the surface of the oxide of the first semiconductor substrate for assembly with the second substrate prior to the assembly step. The surface can prepared by mechanical polishing. It is also contemplated that the oxide layer can have a thickness greater than about 0.2 μm. Moreover, the thermal oxidation can be performed under a dry atmosphere. It is also possible for the thermal oxidation to be performed under a wet atmosphere. The second substrate can include a raw semiconductor substrate. It is also possible for the second substrate to include a bulk semiconductor substrate.

The first semiconductor substrate can have a roughness between about 5 nm and about 10 nm RMS in a high frequency domain prior to performing thermal oxidation. It is also possible for the first semiconductor substrate to have a roughness between about 2 nm and about 10 nm RMS in a low frequency domain prior to performing thermal oxidation.

In accordance with another aspect of the invention, the step of providing the first semiconductor substrate includes fracturing a first initial substrate. The second substrate can be a semiconductor substrate. The second substrate can prepared for assembly with the first substrate by providing the second substrate with a third roughness R3, and performing thermal oxidation on the second substrate until an oxide layer is formed on the second substrate defining a buried oxide-semiconductor interface having a fourth roughness that is less than the third roughness.

The method can also include eliminating at least a portion of the oxide formed on at least one of the first semiconductor substrate and the second substrate. The eliminating step can include etching through at least one opening defined in one of the first semiconductor substrate and the second substrate. The eliminating step can result in forming a membrane defined by one of the first semiconductor substrate and the second substrate. The method can further include a step of thinning at least one of the first semiconductor substrate and the second substrate by mechanical techniques, chemical techniques, and/or substrate fracture.

In accordance with a further aspect of the invention, the thermal oxidation step is carried out at a temperature between about 800° C. and about 1250° C. The thermal oxidation step can be carried out for a period of time between about 30 minutes and about 15 hours, depending, for example, on the temperature used. The oxide layer can have a thickness between about 0.2 μm and about 2 μm. It is also possible for the oxide layer to have a thickness of about 0.5 μm. The buried interface can have a haze between about 10 ppm and about 90 ppm.

The invention also includes a component formed according to the methods described above. The component can be a membrane and/or a mobile part, among others.

It is to be understood that both the foregoing general description and the following detailed description are exemplary and are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

BRIEF DESCRIPTION OF THE DRAWINGS

FIG. 1A is an elevation view of two substrates, one of which has a perforation, prior to the two substrates being bonded together.

FIG. 1B is an elevation view of the two substrates of FIG. 1A after the substrates have been bonded and after the perforation has been fractured to create roughened surfaces.

DETAILED DESCRIPTION OF THE PREFERRED EMBODIMENT

Figure 2A:
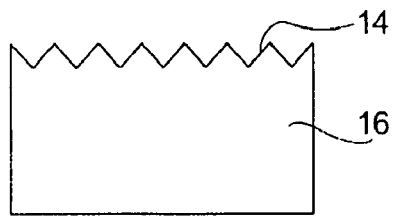
FIG. 2A is an elevation view of one of the roughened substrates of FIG. 1B in accordance with the invention, which roughened substrate is a "Unibond" type negative or rough substrate, prior to the oxidation step of the process according to the invention.

Reference will now be made in detail to the present preferred embodiments of the invention, examples of which are illustrated in the accompanying drawings. The method and corresponding steps of the invention will be described in conjunction with the detailed description of the system.

The devices and methods presented herein may be used for treating substrates in semiconductor materials for microstructure manufacturing. The present invention is particularly suited for providing a manufacturing process for membranes or mobile parts in integrated components wherein undesirable bonding is avoided by providing a specific surface roughness on the components in question. The invention proposed allows greater flexibility regarding the supply or manufacture of substrates with specific roughness, since it allows the roughness of the substrates to be adapted according to need. A process according to the invention allows "Unibond®" wafers (also called "negatives") to be recycled by adapting their surface roughness to the application of desired MEMS, for example in the context of antisticking BSOI manufacturing.

In accordance with the invention, a method for forming a semiconductor component with a rough buried interface is provided, including providing a first semiconductor substrate having a first surface of roughness R1. The method further includes thermally oxidizing the first surface of the first semiconductor substrate to form an oxide layer defining an external oxide surface on the first semiconductor substrate and a buried oxide-semiconductor interface below the oxide surface, wherein the buried oxide surface has a roughness R2 that is less than R1. The method also includes assembling the oxide surface of the first semiconductor substrate with a second substrate.

For purpose of explanation and illustration, and not limitation, a partial view of an exemplary embodiment of the component in accordance with the invention is shown in FIG. 1A and is designated generally by reference character 6. Other embodiments of a component in accordance with the invention, or aspects thereof, are provided in FIGS. 1B-6, as will be described.

In accordance with the invention, a first semiconductor substrate is provided having a first surface of roughness R1. A rough substrate may be obtained by the following process. For purposes of illustration and not limitation, a "Unibond®" wafer or negative, obtained from a Smart CUt™ process or substrate fracture will be described. As illustrated in FIG. 1A, a first semiconductor substrate 6 is provided. This substrate 6 may be "bulk" silicon, for example.

An insulating zone or layer 4, for example a layer of silicon oxide $SiO_2$, is made on substrate 6 by a process such as thermal oxidation. Layer preferably has a typical thickness on the order of several hundreds of nm, for example between 100 nm and 500 nm.

Atomic or ionic implantation is performed in semiconductor substrate 6, forming a thin layer 8 that extends substantially parallel to a surface 11 of the substrate 6. A layer or plane of embrittlement or fracture is formed delimiting a lower region 10 within the volume of substrate 6 intended to comprise a thin film and an upper region 13 comprising the main mass of substrate 6. This implantation is generally hydrogen implantation, but may also be done by using any other suitable species, such as H/He co-implantation.

Substrate 6 thus prepared is then assembled by a molecular bonding technique with a second substrate 2, which is, for example, formed of silicon. Concerning these bonding techniques, one may refer to the work of Q. Y. Tong and U. Gosele, "Semi-conductor Wafer Bonding," (Science and Technology), Wiley Interscience Publications. A part of substrate 6 is then detached by treatment allowing a fracture to be made along the embrittlement plane 8. An example of this technique is described in the article by A. J. Auberton-Hervé et al., "Why can Smart-Cut change the future of microelectronics?" published in the International Journal of High Speed Electronics and Systems, Vol. 10, No. 1 (2000), pp. 131-146.

Two roughened substrates result from the detachment treatment. On the one hand, a semiconductor component or element 12 results. On the other hand, a residual part 16 of substrate 6 is formed from the fracture having a rough surface 14. This residual part includes a rough starting substrate for the rest of the process described below.

Figure 2B:
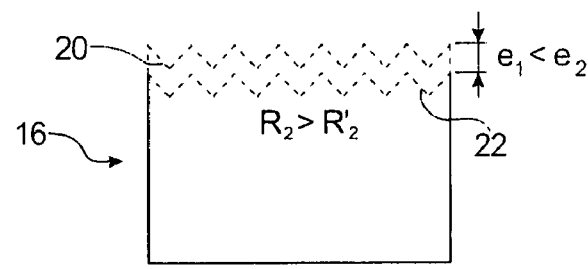
FIG. 2B is an elevation view of a first embodiment of a substrate in accordance with the present invention, showing an external oxide surface and a buried oxide-semiconductor interface below the oxide surface during the oxidation step of the process according to the invention.
Figure 2C:
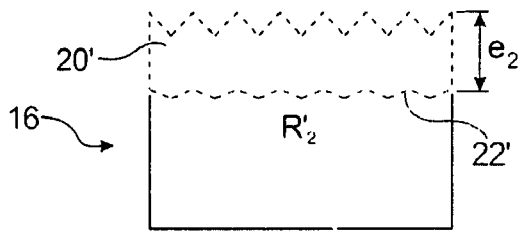
FIG. 2C is an elevation view of the substrate of FIG. 2B in accordance with the present invention, showing the substrate after further oxidation when the oxide-semiconductor interface is deeper and less rough than in FIG. 2B.

For purposes of illustration and not limitation, as embodied herein and as depicted in FIGS. 2A-2C, a rough substrate 16 or "Unibond®" negative, resulting for example from a process such as explained above, is provided. This is then the peeled part of the substrate after layer transfer by the "Smart Cut™" technique. As shown in FIG. 2A, surface 14 of substrate 16 has a roughness R1.

The roughness R1 may vary (and be evaluated, accordingly), for example, from about 5 nm to about 10 nm RMS (on a 5×5 μm² sample) in the high frequency domain, as known in the art. It is also possible to evaluate larger samples (e.g., a 10×10 μm² sample or a 30×30 μm² sample, among others). The peaks may accordingly be evaluated quantitatively, under direct observation.

The roughness may also vary (and be evaluated, accordingly), by way of further example, from about 2 nm to about 10 nm RMS in the low frequency domain, as known in the art. This low frequency roughness measures the variation of the planarity of the surface from a first point to a second point on the surface, such as by using a profilometer. For example, such a measurement may be obtained by using such a mechanical surface roughness measuring instrument with a 2 μm tip and by performing one or more 500 μm scans. The roughness of the selected substrate 16 is adapted, for example, to use in MEMS type applications such as in sensors having membranes, and the like.

In further accordance with the invention, the first surface of the first semiconductor substrate is oxidized to form an oxide layer defining an external oxide surface on the first semiconductor substrate and a buried oxide-semiconductor interface below the oxide surface. The buried oxide surface has a roughness R2 that is less than R1.

For this purpose, desoxidation of the negative substrate 16 is preferably performed. Substrate 16 is then cleaned by CARO RCA or ozone RCA type cleaning. A possible cleaning with TMAH (tetramethylammonium hydroxide chemical etching step) may be performed, which allows thinning of approximately 2 to 3 μm of the material, thus eliminating an area disturbed by the implantation step. Then the substrate 16 is oxidized under dry or wet atmosphere to create an oxide layer a thickness of, for example, between 0.2 μm and 2 μm, preferentially on the order of 0.5 μm. For a dry atmosphere, diatomic oxygen ($O_2$) is generally used, whereas for a wet atmosphere diatomic hydrogen ($H_2$) and diatomic oxygen ($O_2$) are typically used.

Due to the roughness of surface 14 of substrate 16, the oxidation front 22 (FIG. 2B) is irregular. Part of the roughness of surface 14 is imparted to an oxide/silicon interface (front 22) in substrate 16 at a depth that depends on the oxidation conditions, and particularly on the temperature and duration of oxidation. FIGS. 2B and 2C represent the same substrate 16 after oxidation of duration $t_1$ and after oxidation of duration $t_2 > t_1$, respectively. As described herein, typical suitable times and temperatures for oxidation range from about 30 minutes to about 15 hours, and from about 800° C. to about 1250° C. The oxidations of FIGS. 2B and 2C were actually performed at the same temperature. The oxide layer 20 of the first case has a thickness $e_1$ inferior to $e_2$, the thickness of the oxide layer 20' of the second case, while the respective roughnesses are:

$$R'_2 < R_2 < R_1.$$

By controlling the thickness $e_{1,2}$ of the oxide generated, the spatial frequencies and amplitude (RMS, PV) of the desired final roughness (R2) at the level of the oxide/silicon interface can be controlled. Depending on the thickness of oxide 20, 20' generated, the roughness of interface 22, 22' is more or less reduced, which allows the resulting roughness at the level of the oxide/silicon interface (R2) to be controlled.

Figure 3:
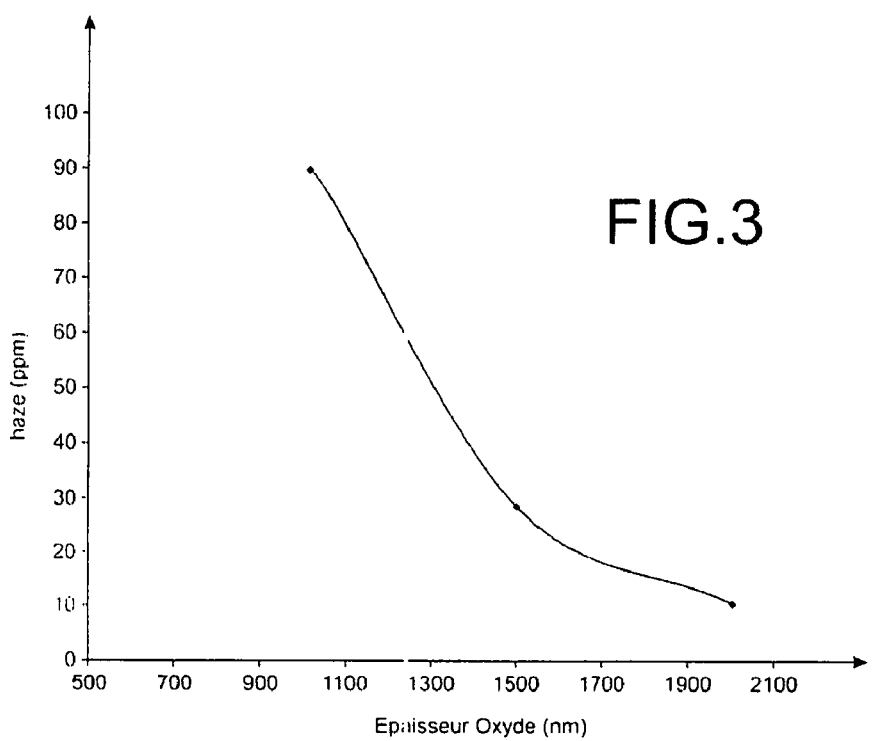
FIG. 3 is a graph showing haze (ppm) as a function of oxide thickness (nm) for surfaces roughened in accordance to the present invention.

FIG. 3 represents the evolution of the "haze" measured on the silicon surface (after oxide removal) with TENCOR (6200) surfscan type equipment according to the thickness ($e_{1,2}$) of oxide obtained after the oxidation step. The "haze" is representative of the light diffused by the roughened surface and is therefore representative of the roughness of this surface. The "haze" therefore allows information on the surface roughness to be obtained as a function of the thickness of oxide formed. FIG. 3 shows that in the 0.5 μm-2 μm or 1 μm-2 μm range of thicknesses, and even beyond 2 μm, roughness is reduces significantly as oxide thickness is increased. A similar effect may also be obtained for thicknesses greater than 0.2 μm.

The initial rough substrate 16 may therefore be treated in view of its intended utilization for the fabrication of different categories of components. Such a substrate treated according to the invention, comprising a predetermined rough buried oxide/silicon interface may be utilized for different applications. A substrate treated according to the invention may therefore be employed for manufacturing antisticking BSOI substrates, as "top" and/or support substrates.

In further accordance with the invention, the oxide surface of the first semiconductor substrate is assembled with a second substrate. For purposes of illustration and not limitation, as depicted in FIGS. 4A-5B, bonding of the oxidized substrate to the rough interface may be carried out as follows.

Figure 4A:
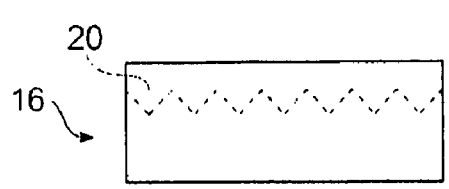
FIG. 4A is an elevation view of the substrate of FIG. 2C in accordance with the present invention, showing the external oxide surface after being polished.

Preparing the surface of the oxide is recommended prior to bonding and an optional mechanical peripheral edge removal step may also be done in order to eliminate the crown that was not eliminated by oxidation. As illustrated in FIG. 4A, a mechanical polishing step may be performed to restore good surface roughness (that is, a roughness adapted to bonding) of the oxide layer 20 (or 20').

Figure 4B:
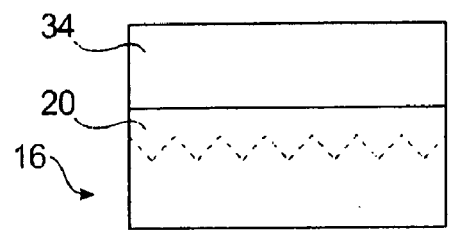
FIG. 4B is an elevation view of the substrate of FIG. 4A in accordance with the present invention, showing a second substrate bonded to the polished surface of the oxide layer.
Figure 5A:
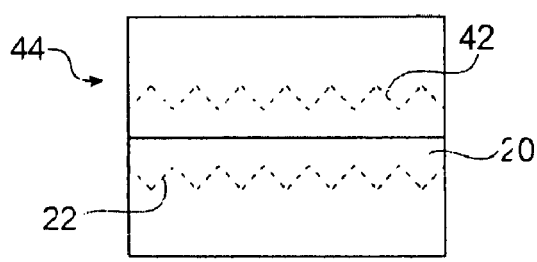
FIG. 5A is an elevation view of another embodiment of a substrate assembly in accordance with the present invention, wherein two substrates as shown in FIG. 4A are bonded together at the respective polished surfaces.

As illustrated in FIG. 4B, bonding, for example direct or molecular adhesion bonding, may then be performed on a second substrate 34, made of bulk silicon, for example. This second substrate 34 may then be thinned. Any suitable thinning technique, such as a mechanical technique, a chemical technique, a mechanical chemical technique or the "Smart Cut™" process may be implemented without departing from the spirit and scope of the invention. Direct bonding may also be carried out on a second substrate 44, itself having a rough buried interface 42, as shown in FIG. 5A. Substrate 44 can be obtained according to the process described above.

Figure 5B:
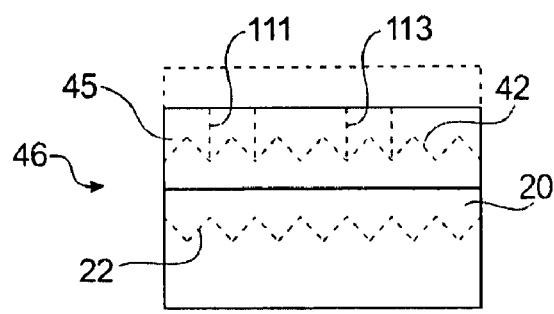
FIG. 5B is an elevation view of the substrate assembly of FIG. 5A in accordance with the present invention, showing one of the substrates having been thinned, and showing openings through which the oxide layer can be removed by etching.

The assembled structure may be submitted to thermal treatment to reinforce the bonding interface. One or more thinning steps can also be performed as needed, depending on the application. The result is a BSOI structure 46 comprising one or two rough oxide/silicon interfaces. FIG. 5B represents such a structure with two rough interfaces 22, 42 and one residual layer 45 of the second substrate.

Figure 6:
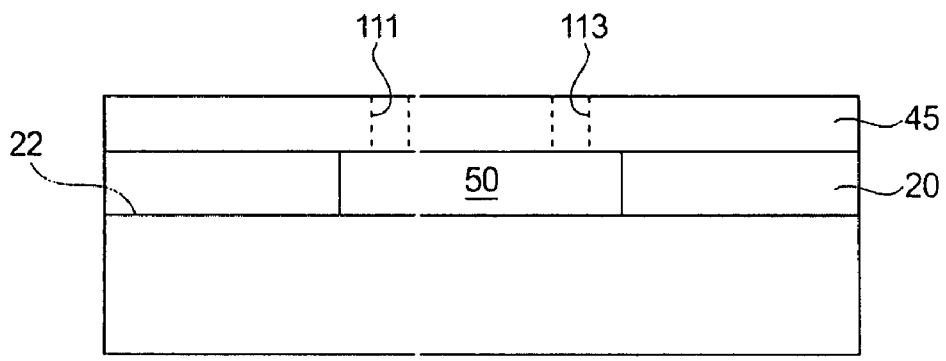
FIG. 6 is an elevation view of another embodiment of a substrate assembly in accordance with the present invention, showing a cavity between two substrates after etching the oxide layer through the openings into the cavity.

During production of integrated sensor membranes or mobile parts, part of oxide 20 may then be locally removed by etching through openings 111, 113 made in the residual layer 45. In this manner, it is possible to locally create cavities under membranes. The rough interface 42 prevents untimely bonding or adherence of the membrane on the substrate 14. FIG. 6 represents such a cavity 50 in substrate 46 after etching of the oxide layer 20 through openings 111, 113 of layer 45, a portion of which is situated above the cavity 50 to form a membrane.

The examples given above implement a silicon substrate. However, those skilled in the art will readily appreciate that the invention may be applied to all semiconductor substrates that may be oxidized, including monocrystalline Si, polycrystalline Si, amorphous Si, and SiC.

The methods and systems of the present invention, as described above and shown in the drawings, provide for a method for forming a semiconductor component with a rough buried interface with superior properties including procedures for controlling the surface roughness of key components in a substrate assembly. It will be apparent to those skilled in the art that various modifications and variations can be made in the device and method of the present invention without departing from the spirit or scope of the invention. Thus, it is intended that the present invention include modifications and variations that are within the scope of the appended claims and their equivalents.

What is claimed is:

1. A method for forming a semiconductor component with a rough buried interface, the method comprising:
    a) fracturing an initial semiconductor substrate to provide a first semiconductor substrate having a first surface of roughness R1;
    b) performing a first thermal oxidation on the first surface of the first semiconductor substrate to form a first oxide layer defining an external oxide surface on the first semiconductor substrate and a first buried oxide-semiconductor interface below the external oxide surface, wherein the first buried oxide-semiconductor interface has a roughness R2 that is less than R1;
    c) providing a second substrate with a roughness R3;
    d) performing a second thermal oxidation on the second substrate until a second oxide layer is formed on the second substrate defining a second buried oxide-semiconductor interface having a fourth roughness that is less than the third roughness;
    e) assembling the external oxide surface of the first semiconductor substrate with the second substrate; and
    f) thinning at least one of the first semiconductor substrate and the second substrate by a process selected from the group consisting of mechanical techniques, chemical techniques, and substrate fracture.

2. A method as recited in claim 1, further comprising preparing the external oxide surface of the first semiconductor substrate for assembly with the second substrate prior to the assembly step.

3. A method as recited in claim 2, wherein the external oxide surface is prepared by mechanical polishing.

4. A method as recited in claim 1, wherein the first thermal oxidation is performed under a dry atmosphere.

5. A method as recited in claim 1, wherein the first thermal oxidation is performed under a wet atmosphere.

6. A method as recited in claim 1, wherein the first semiconductor substrate has a roughness between about 5 nm and about 10 nm RMS on a 5×5 $\mu m^2$ sample prior to performing the first thermal oxidation.

7. A method as recited in claim 1, wherein the first semiconductor substrate has a roughness between about 2 nm and about 10 nm RMS, prior to performing the first thermal oxidation.

8. A method as recited in claim 1, wherein the second substrate includes a raw semiconductor substrate.

9. A method as recited in claim 1, wherein the second substrate includes a bulk semiconductor substrate.

10. A method as recited in claim 1, further comprising eliminating at least a portion of the oxide layer formed on at least one of the first semiconductor substrate and the second substrate.

11. A method as recited in claim 10, wherein the eliminating step includes etching through at least one opening defined in one of the first semiconductor substrate and the second substrate.

12. A method as recited in claim 11, wherein the eliminating step results in forming a membrane defined by one of the first semiconductor substrate and the second substrate.

13. A method as recited in claim 1, wherein the first thermal oxidation step is carried out at a temperature between about 800° C. and about 1250° C.

14. A method as recited in claim 1, wherein the first thermal oxidation step is carried out for a period of time between about 30 minutes and about 15 hours.

15. A method as recited in claim 1, wherein the first oxide layer has a thickness between about 0.2 μm and about 2 μm.

16. A method as recited in claim 15, wherein the first oxide layer has a thickness of about 0.5 μm.

17. A method as recited in claim 1, wherein the first buried oxide-semiconductor interface has a haze between about 10 ppm and about 90 ppm.

* * * * *